United States Patent
Wu (10) Patent No.: US 7,112,505 B2
(45) Date of Patent: Sep. 26, 2006

(54) METHOD OF SELECTIVELY ETCHING HSG LAYER IN DEEP TRENCH CAPACITOR FABRICATION

(75) Inventor: Yung-Hsien Wu, Taipei (TW)

(73) Assignee: ProMos Technologies, Inc., Hsinchu (TW)

( * ) Notice: Subject to any disclaimer, the term of this patent is extended or adjusted under 35 U.S.C. 154(b) by 197 days.

(21) Appl. No.: 10/793,928

(22) Filed: Mar. 8, 2004

(65) Prior Publication Data
US 2005/0112839 A1 May 26, 2005

(30) Foreign Application Priority Data
Nov. 25, 2003 (TW) .............................. 92133002 A (51) Int. Cl.
*H01L 21/76* (2006.01)

(52) U.S. Cl. ................ 438/386; 438/243; 257/E21.012

(58) Field of Classification Search ................ 438/243, 438/255, 386, 398
See application file for complete search history.

(56) References Cited

U.S. PATENT DOCUMENTS

| 4,681,657 A * | 7/1987 | Hwang et al. ............... 438/753 |
| 6,177,696 B1 | 1/2001 | Bronner et al. ............. 257/301 |
| 6,537,872 B1 * | 3/2003 | Tsao et al. ................... 438/244 |
| 6,555,430 B1 | 4/2003 | Chudzik et al. ............ 438/243 |
| 6,639,266 B1 * | 10/2003 | Yates et al. ................. 257/309 |
| 2004/0214391 A1 * | 10/2004 | Chen et al. ................. 438/243 |

* cited by examiner

*Primary Examiner*—Bradley K. Smith
(74) *Attorney, Agent, or Firm*—Birch, Stewart, Kolasch, and Birch, LLP (57) ABSTRACT

The invention provides a method of selectively etching a Hemispherical Silicon Grain (HSG) layer during deep trench capacitor fabrication. A substrate having a pad structure and a deep trench is provided. A buried oxide layer is formed on the upper sidewall of the deep trench and a HSG layer and an ASG layer are formed in the deep trench sequentially. A mask layer is filled into the deep trench and recessed; the exposed ASG layer is then removed. The HSG layer is doped to form a plasma doping layer on the upper portion of the deep trench, which is removed without damaging the silicon substrate. After the mask layer is removed, a cap oxide layer is formed on the deep trench, and the substrate is subjected to a thermal treatment to form a buried plate.

21 Claims, 9 Drawing Sheets

METHOD OF SELECTIVELY ETCHING HSG LAYER IN DEEP TRENCH CAPACITOR FABRICATION

This Nonprovisional application claims priority under 35 U.S.C. § 119(a) on patent application No(s). 092133002 filed in TAIWAN on Nov. 25, 2003, the entire contents of which are hereby incorporated by reference.

BACKGROUND OF THE INVENTION

1. Field of the Invention

The present invention relates in general to a method of a deep trench capacitor fabrication, and in particular, to a method of selectively etching a HSG (hemispherical Silicon Grain) layer in a deep trench capacitor.

2. Description of the Related Art

DRAM capacitors generally consist of two electrodes isolated by an insulating material. The electrical charge capability of DRAM is determined by the thickness of the insulating material, the surface area of the electrodes and the electrical properties of the insulating material. As ICs become more compact, semiconductor designs have reduced device dimensions which increase density to accommodate a large number of memory cells. Conversely, memory cell electrodes must provide sufficient surface area for electrical charge storage. Furthermore, high dielectric constant (high k) dielectric materials are adopted to increase the capacitance of the memory cells, in addition, as DRAM becomes more compact, deep trench type capacitors are widely used to increase surface area. Hence, HSG technology is used to increase the surface area of the electrode plate of the trench capacitor. U.S. Pat. Nos. 6,177,696, 6,537,872 and 6,555,430 disclose applications for forming HSG on a trench-type capacitor.

Figure 1A:
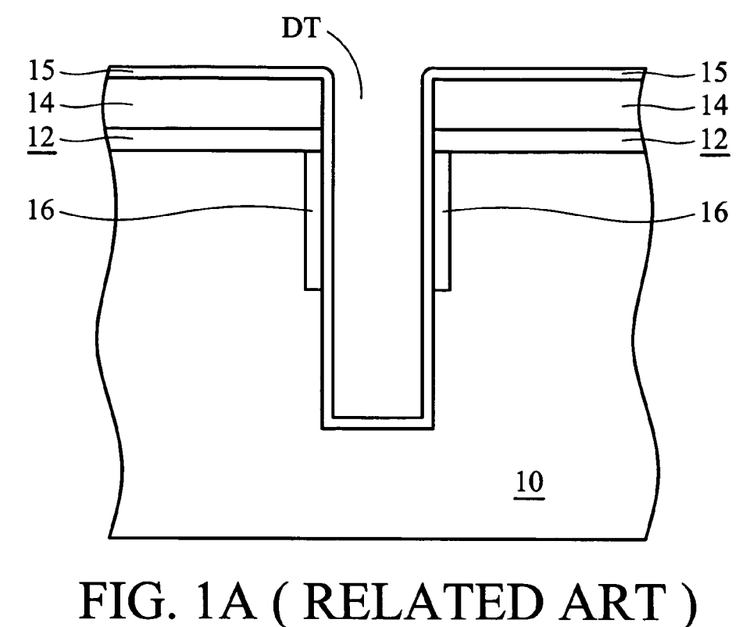
FIGS. 1A–1I are cross sections showing fabrication of the conventional HSG layer in a deep trench capacitor.

In FIG. 1A, a semiconductor substrate 10 having a pad oxide layer 12, a pad nitride layer 14, a deep trench DT, a collar dielectric layer 16 on the upper sidewall of the deep trench DT, and an etch stop layer 15 on the sidewall and bottom of the deep trench, such as an oxide layer is provided.

Figure 1B:
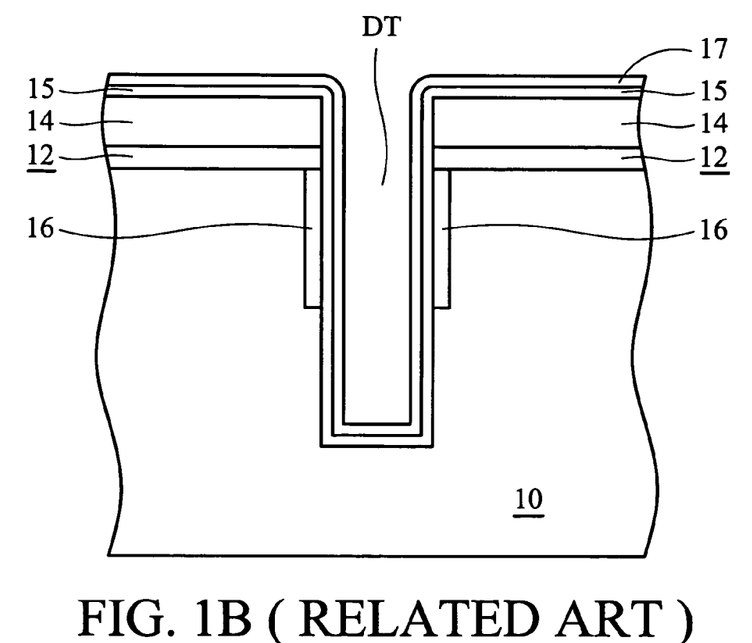
Figure 1C:
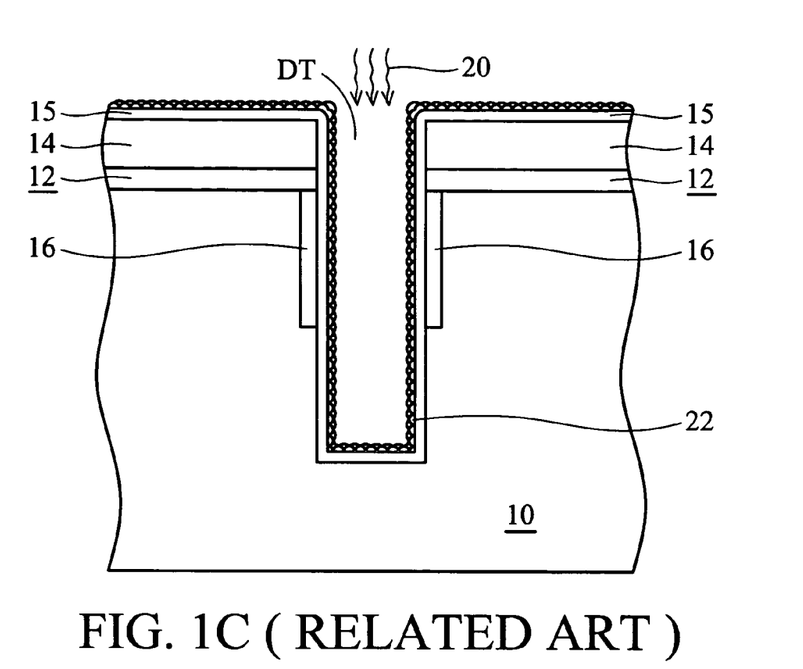

Next, in FIG. 1B, an amorphous silicon (α-Si) layer 17 is formed on the etch stop layer 15. In FIG. 1C, a doping dielectric layer is formed on the α-Si layer 17, with the proper concentration, flow rate and time. The α-Si layer 17 then forms a HSG layer 22 in-situ, increasing the surface area of the trench DT.

Figure 1D:
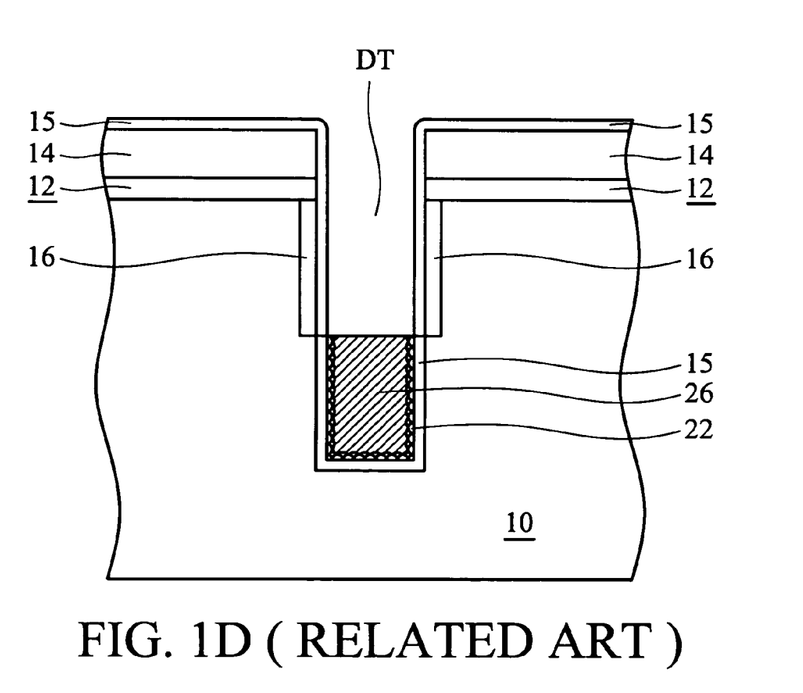
Figure 1E:
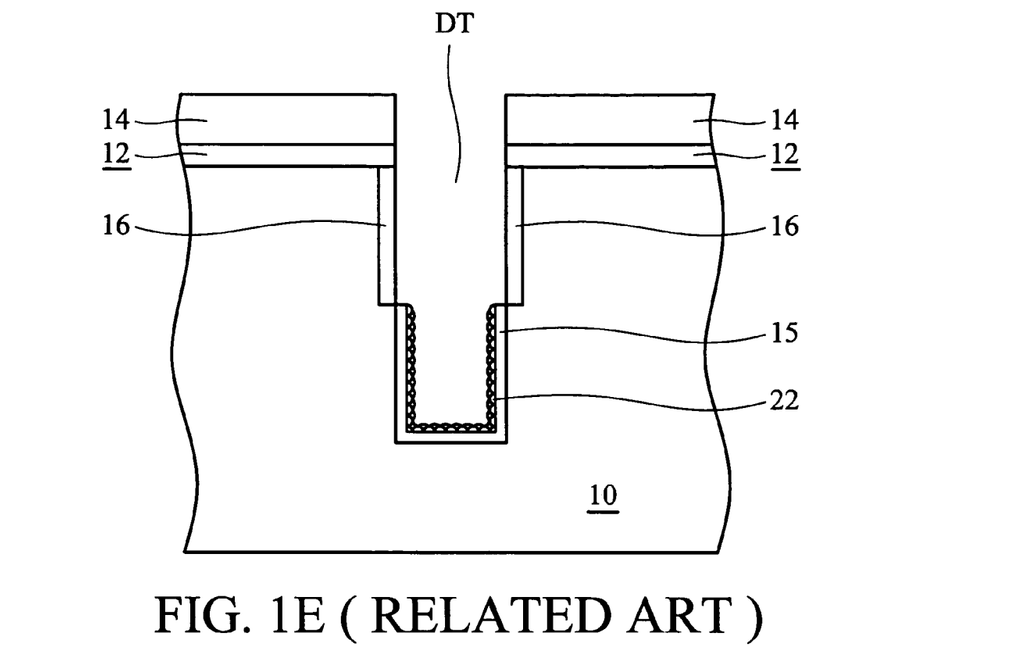

Subsequently, in FIG. 1D, a first resist layer 26 is filled into the deep trench DT, and recessed to a predetermined depth of the lower of the deep trench DT. Then, using the recessed resist 26 as an etching mask, the HSG layer 22 in the upper portion of the deep trench is etched. Since the etching selectivity of the deep trench silicon substrate to the HSG layer is very low, when etching the HSG layer 22, the etch stop layer 15 is required as a buffer to insulate and protect the deep trench silicon substrate. Next, in FIG. 1E, the etch stop layer 15 in the upper portion of the deep trench DT is etched, and the first resist layer 26 is then removed from the deep trench DT.

Figure 1F:
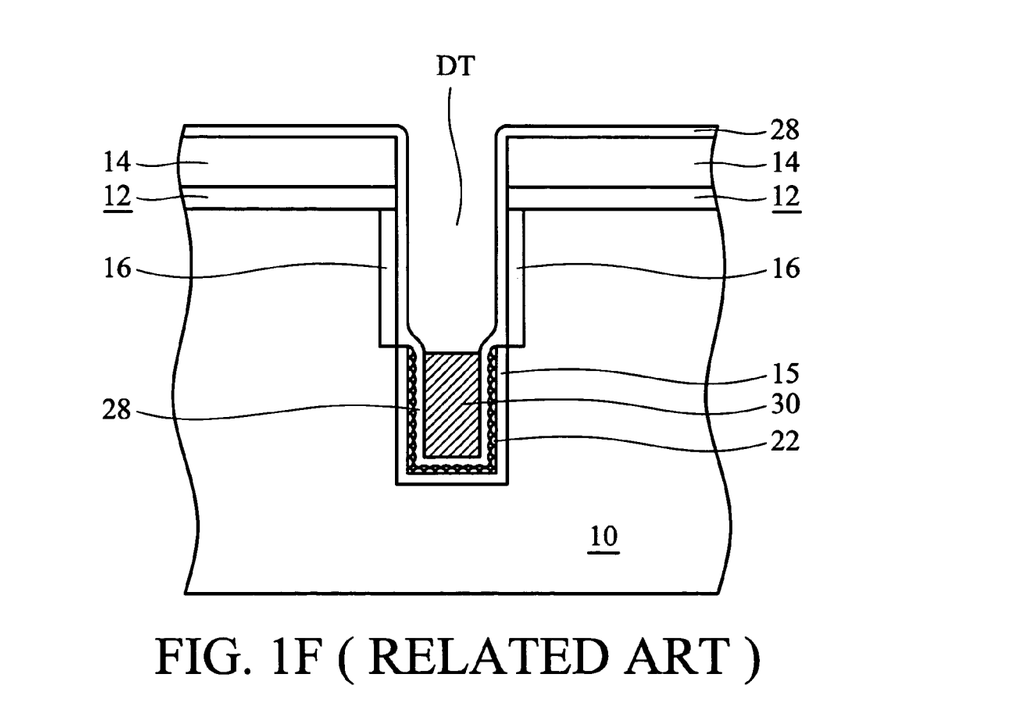
Figure 1G:
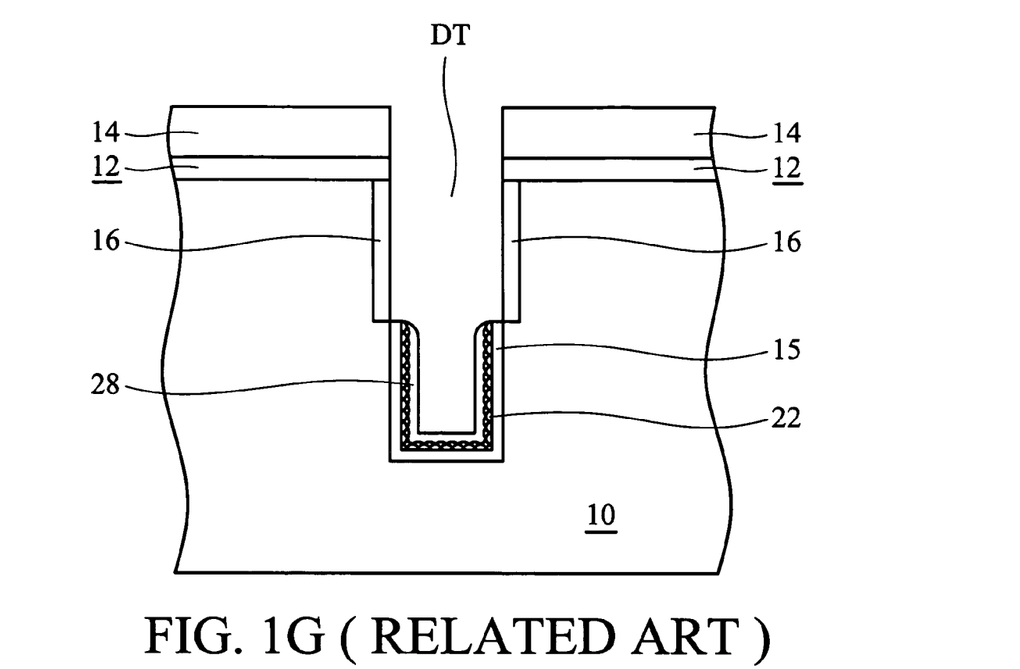

Next, in FIG. 1F, an ASG layer 28 is formed on the bottom and sidewall of the deep trench DT, then a second resist layer 30 is formed on the ASG layer 28 and recessed to a predetermined depth in the lower portion of the deep trench DT. Subsequently, in FIG. 1G, using the recessed second resist layer 30 as an etching mask, the ASG layer 28 in the upper portion of the deep trench DT is etched, and the second resist layer 30 is then removed.

Figure 1H:
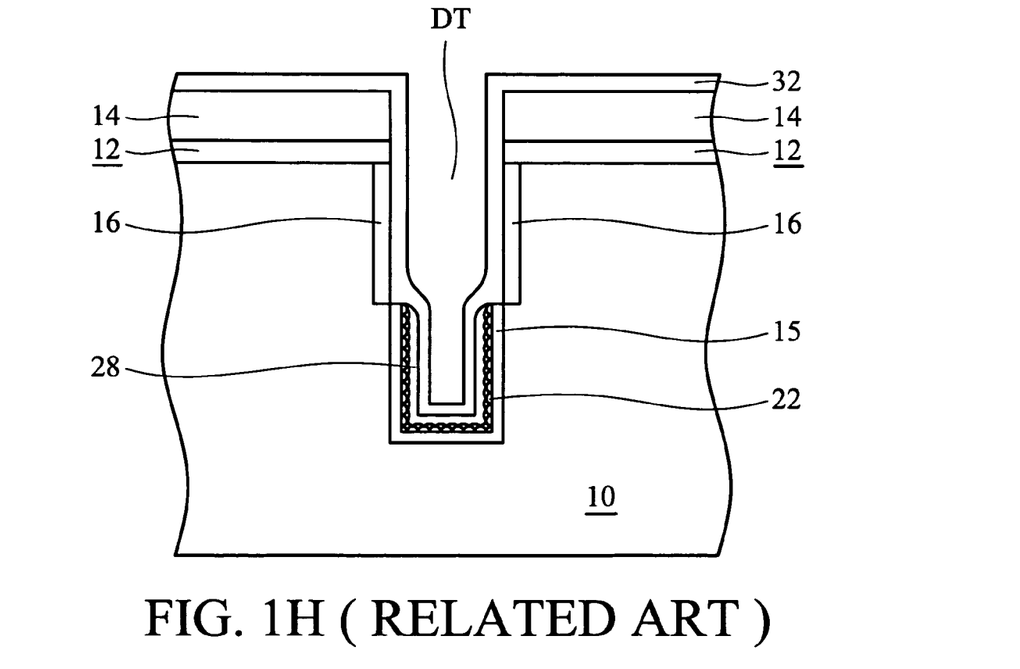
Figure 1I:
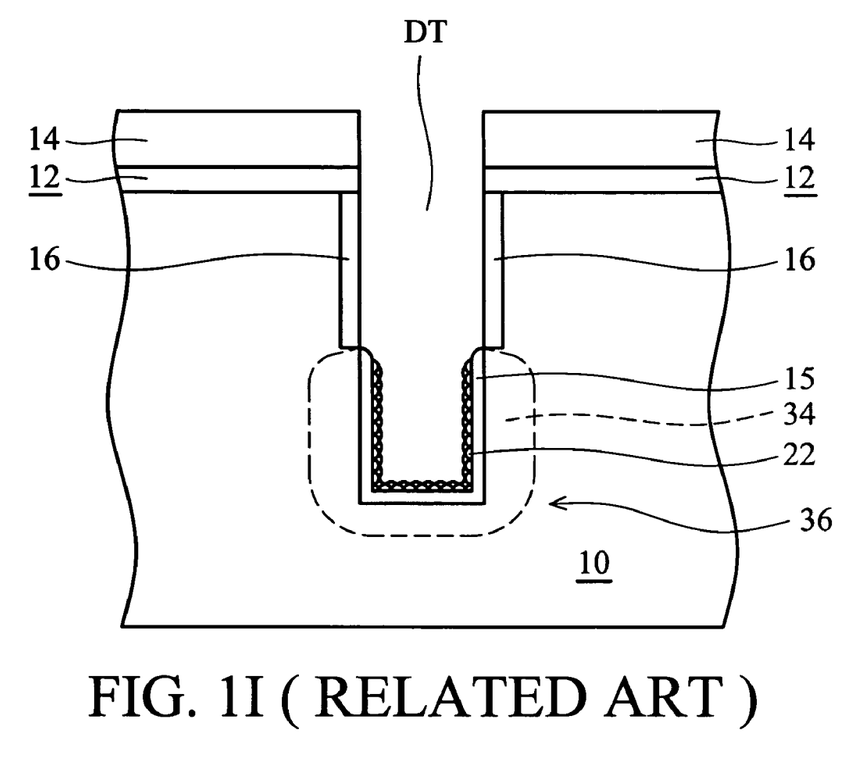

In FIG. 1H, a cap oxide layer 32 is formed in the bottom and on the sidewall of the deep trench, subsequently, In FIG. 1I, a thermal process is performed to diffuse the $As^+$ out of the ASG layer 28 to the lower area of the deep trench DT, forming an $n^+$-type diffusion area 34 to serve as a buried plate 34 of the deep trench capacitor 36. Finally, the ASG layer 28 and the cap oxide layer 32 are etched and removed from the deep trench DT, accomplishing fabrication of the deep trench capacitor 36 with HSG layer.

The above described conventional fabrication steps are complicated, requiring not only two steps of resist coating/recessing, but also an additional etching stop layer to insulate the HSG layer and the deep trench silicon substrate. The purpose of the above processes is to prevent direct formation of the HSG layer on the upper sidewall of the deep trench, such that the HSG layer and the silicon substrate of the deep trench do not make contact. The reason being the single crystal silicon substrate is very similar to the HSG layer in physical properties, so that the etching selectivity of the both is nearing the same, resulting in damage to the silicon substrate when the HGS layer is etched, and further, extending the deep trench, resulting in sub-threshold voltage (sub-Vt) leakage.

The above process uses an etching stop layer formed between the silicon substrate and the HSG layer to overcome the problem, however, the process is too complicated, and, the etching stop layer will form a parasitic capacitance within the buried plate at the lower of the deep trench, impacting the capacitance of the capacitor as a result.

SUMMARY OF THE INVENTION

Accordingly, an object of the invention is to provide a method for selectively etching the HSG layer, without damaging the silicon substrate.

Another object of the invention is to provide a method for selectively etching the HSG layer, coupled with the requisite tuned etching solution and the plasma doping process, to effectively remove the HSG layer.

Yet another object of the invention is to provide a method of deep trench capacitor fabrication. Before forming the HSG layer, a buried dielectric layer is formed instead of the conventional collar oxide layer using oxygen implantation, acting as a barrier layer to block the dopant from subsequent thermal process when forming the HSG layer, preventing the diffusion of the dopant into the silicon substrate of the deep trench sidewall.

Still another object of the invention is to provide a process, for simplifying the conventional HSG layer in deep trench capacitor fabrication.

In order to achieve the above objects, the invention provides a method of selectively etching the HSG layer, and a fabrication process for the deep trench capacitor. Using a plasma doping process, the sheet resistance of the HSG layer is reduced, resulting in an increase of the etching rate of the HSG layer, such that the HSG layer is easier to remove than silicon substrate. The method of the invention comprises providing a silicon substrate having a pad oxide layer, a pad nitride layer and a deep trench, then, forming a buried dielectric layer on the upper sidewall of the deep trench, forming a HSG layer on the sidewall and bottom of the deep trench, forming a doping dielectric layer in the deep trench and covering the HSG layer, filling and recessing a mask layer into the deep trench to a predetermined depth, removing the portion of the doping dielectric layer not covered by the mask layer. Doping the HSG layer not covered by the mask layer to form a plasma doping layer, etching the plasma doping layer not covered by the mask layer and then removing the mask layer. Forming a cap oxide layer on the sidewall and bottom of the deep trench, performing a thermal process to form a buried plate of the deep trench capacitor, finally removing the cap oxide layer and the doping dielectric layer from the deep trench.

Further scope of the applicability of the present invention will become apparent from the detailed description given hereinafter. However, it should be understood tat the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE DRAWINGS

The present invention will become more fully understood from, the detailed description given hereinbelow and the accompanying drawings, which are given by way of illustration only, and thus are not limitative of the present invention, and in which.

DETAILED DESCRIPTION OF THE INVENTION

In this specification, "overlying the substrate", "above the layer", or "on the film" denote a relative positional relationship with respect to the surface of the base layer, regardless of the existence of intermediate layers. Accordingly, these expressions may indicate not only the direct contact of layers, but also, a non-contact state between one or more laminated layers.

Figure 2A:
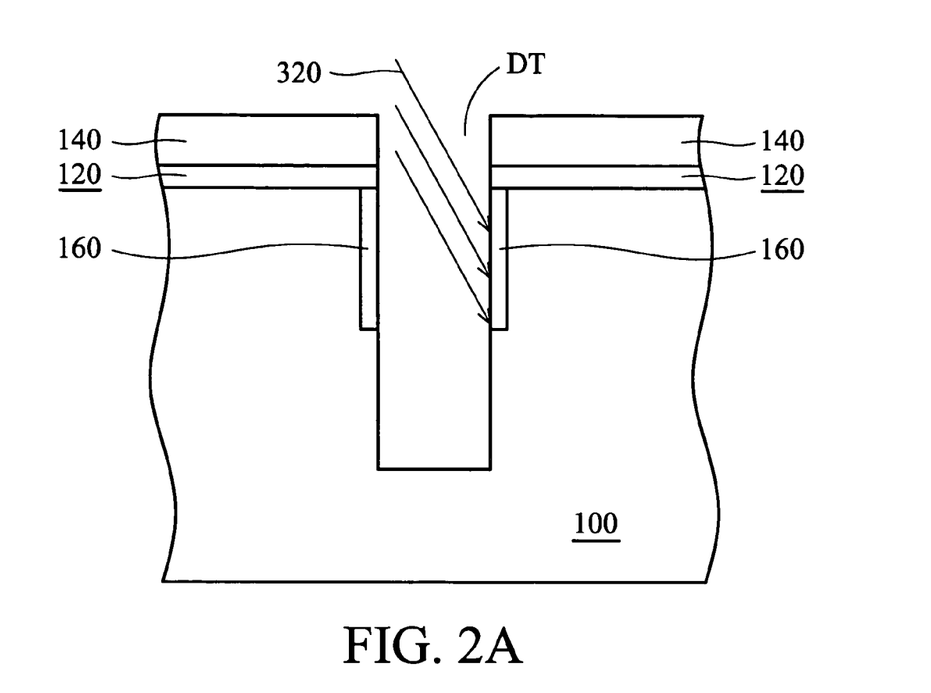
FIGS. 2A~2H are cross sections showing fabrication of the HSG layer in a deep trench capacitor according to the present invention.

In FIG. 2A, a silicon substrate 100 is provided having a pad oxide layer 120 formed by thermal oxidation, with a thickness of about 30~50 Å, a pad nitride layer 140 formed by low pressure chemical vapor deposition (LPCVD), with a thickness of about 1500~2200 Å, and a deep trench DT. Next, using ion implantation, such as $O^+$ implantation 320, with an implantation dosage of about 0.5~2E18, an energy of about 50~70 KeV, and a tilt angle of about 8~12° (optimal 10°), coupled with a high temperature thermal process, such as annealing, with process conditions of 1000~1100° C./50~90 sec, a buried dielectric layer 160 is formed on the silicon substrate of the upper sidewall of the deep trench DT. The purpose of this process is to provide the following advantages. During the process of forming a HGS layer, the buried dielectric layer 160 acts as a barrier layer to block the diffusion of the dopant through inside of the silicon substrate at the sidewall of the deep trench, avoiding the adverse effect at the junction area. Additionally, since the buried dielectric layer is very thin, it allows a tolerant thermal budget for the subsequent thermal processes, effectively suppressing the leakage current of the capacitor device.

Figure 2B:
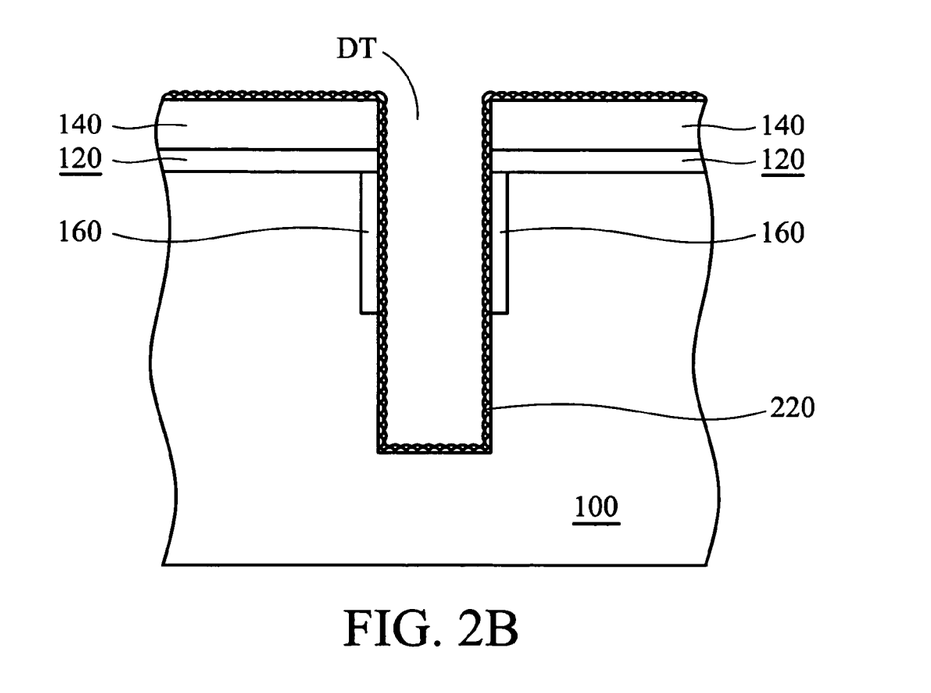
Figure 2C:
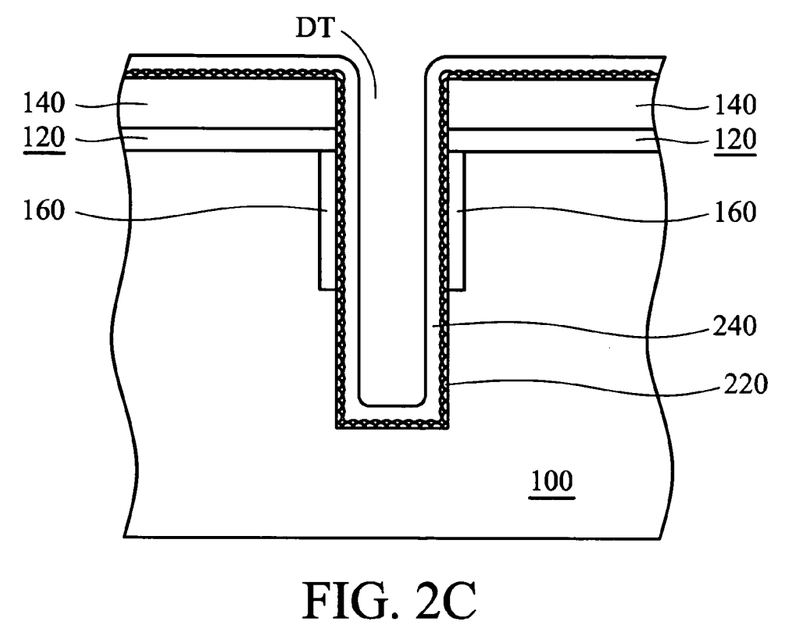
Figure 2D:
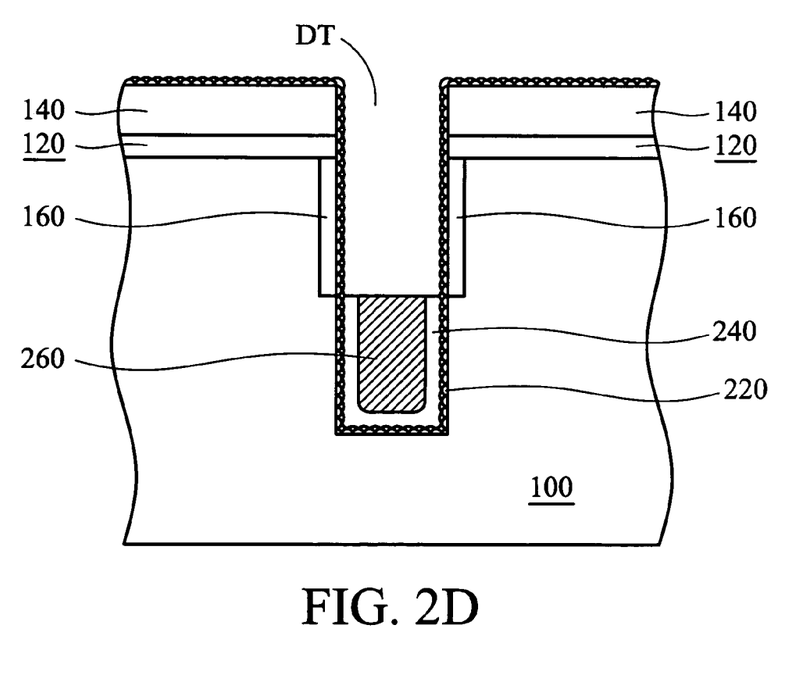

In FIG. 2B, using low pressure chemical vapor deposition (LPCVD), a HSG layer 220, is formed at a temperature of about 500~550° C., on the sidewall and bottom of the deep trench DT to increase the surface area, increasing the capacitance of the subsequent deep trench capacitor fabrication. Next, in FIG. 2C, a doping dielectric layer 240, such as a ASG layer, is formed on the HSG layer 220 using low pressure chemical vapor deposition (LPCVD), with a thickness of about 250~380 Å. In FIG. 2D, a mask layer 260, such as a resist layer, is filled into the deep trench DT using spin-coating, then recessed to a predetermined depth to define the subsequent buried plate area, next, the portion of the doping dielectric layer 240 not covered by the mask layer 260 is removed using anisotropic etching, exposing the HSG layer 220.

Figure 2E:
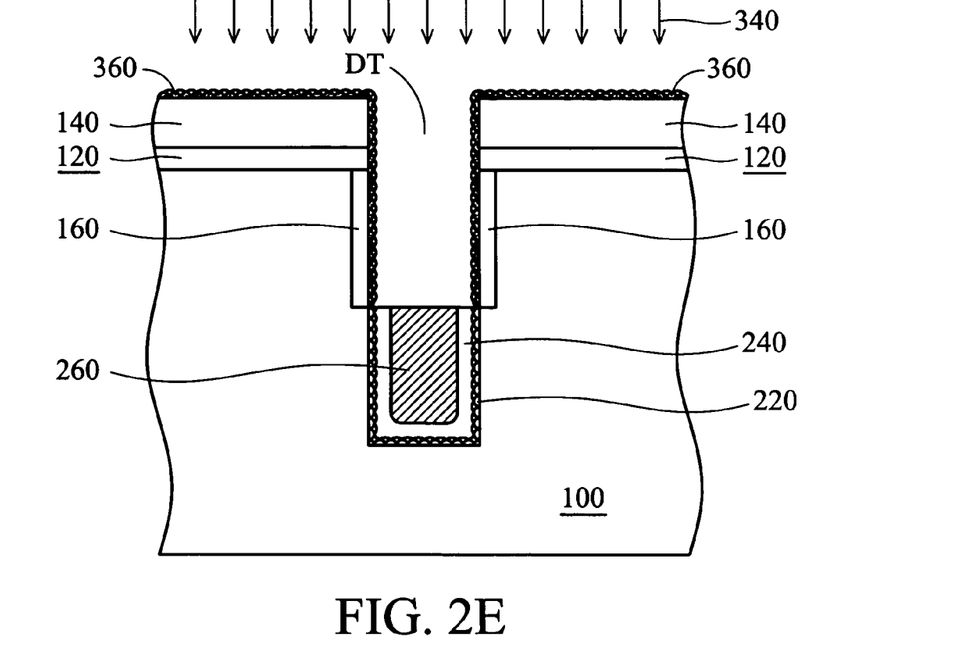

Subsequently, in FIG. 2E, a plasma doping layer 360 is formed on the exposed HSG layer 220 not covered by the mask layer 260 using ion doping 340, such as $B^+$, with dosage of about 1E17~1E19 $cm^{-3}$, such that the sheet resistance of the HSG surface is decreased, resulting in an increased etching rate, therefore, the etching selectivity of the plasma doping layer 360 to deep trench silicon substrate 100 is increased from the original 1:1 to 1:20 (optimal 1:30) after plasma doping, the resulting etching speed is much higher for plasma doping layer 360 than for silicon substrate 100, so that the plasma doping layer 360 is easily removed without damaging the silicon substrate 100.

Figure 2F:
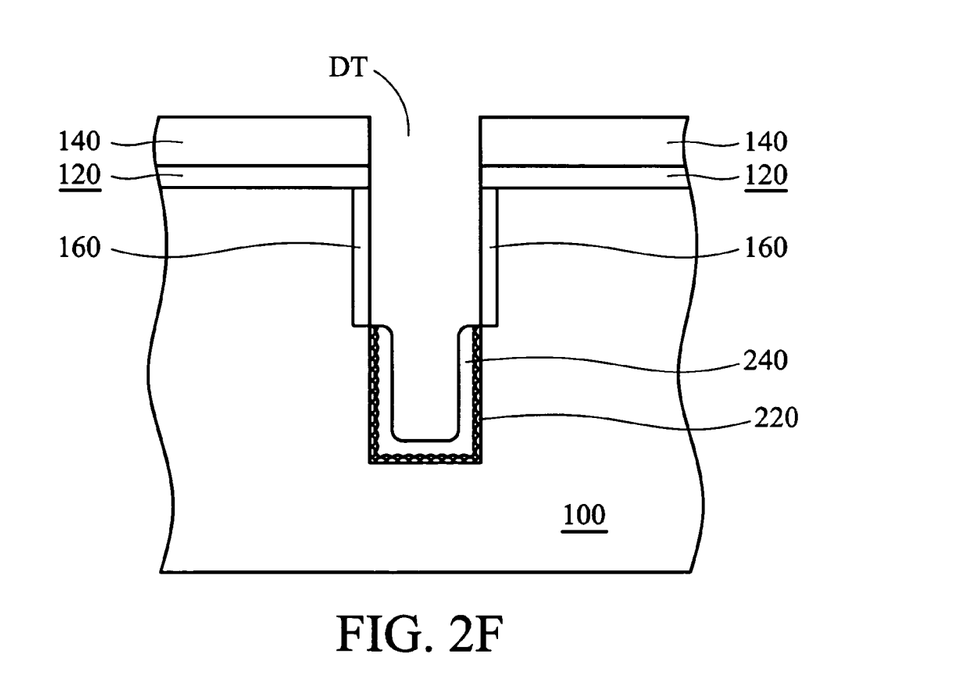

In FIG. 2F, a tuned mixture of acid etching solution, such as $HF:HNO_3:CH_3COOH$, with a ratio of 1~1.5:3~3.3:8~8.2 (optimal 1:3:8), is used to remove the plasma doping layer 360 (low sheet resistance HSG layer) not covered by mask layer 260 using isotropic wet etching, the remaining mask layer 260 is then removed.

Figure 2G:
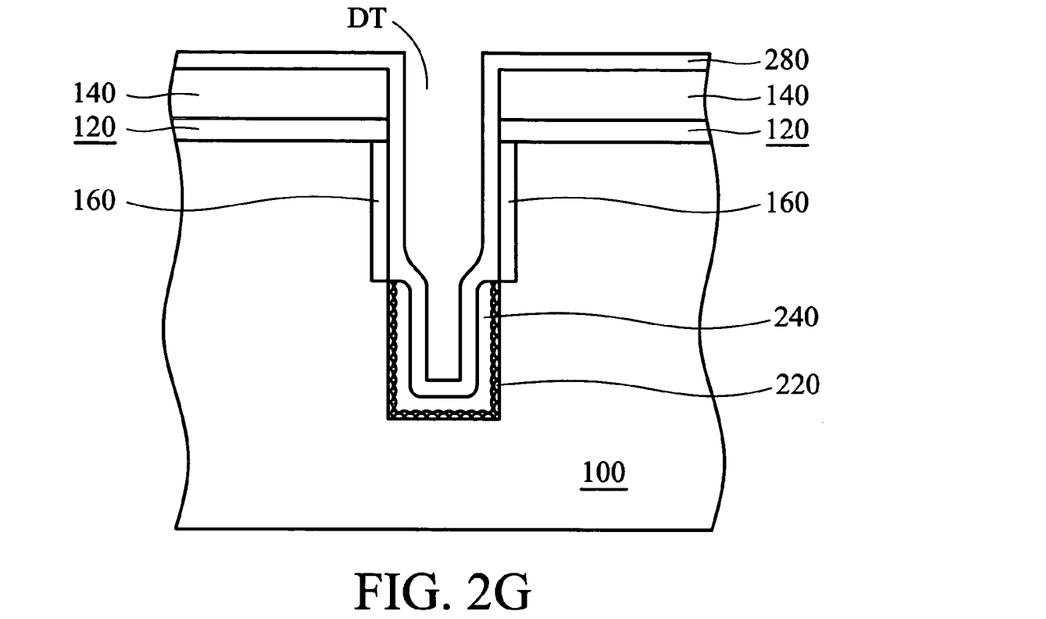
Figure 2H:
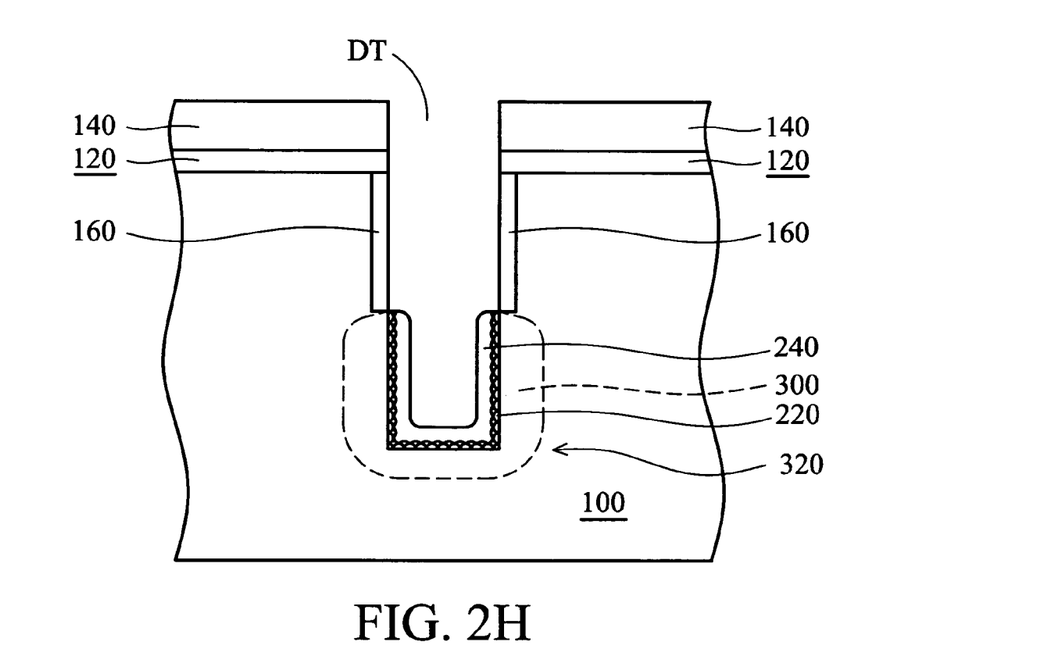

Next, in FIG. 2G, a cap oxide layer 280 is formed on the exposed deep trench DT using plasma enhanced chemical vapor deposition (PECVD), such as a TEOS. In FIG. 2H, using a thermal process, such as annealing, the $As^+$ of the doping dielectric layer 240 (ASG) is diffused to the lower area of the deep trench DT, forming an $n^+$-type diffusion area 300 to act as a buried plate 300 of the deep trench capacitor 320. The formed cap oxide layer 280 is an insulating layer between the $n^+$-type diffusion area 300 and subsequent buried strap out-diffusion area, finally the doping dielectric layer 240 and the cap oxide layer 280 on the deep trench DT are removed using isotropic wet etching, such as BHF-dip+ DHF, forming a bottom electrode of the deep trench capacitor.

To selectively etch the HSG layer, the present invention provides the following advantages. Before fabrication of the HSG layer, a buried dielectric layer is formed instead of the conventional collar oxide layer using oxygen implantation, acting as a barrier layer to block the dopant from subsequent thermal processes when forming the HSG layer, preventing diffusion of dopant into the silicon substrate of the deep trench sidewall. In addition, since the buried dielectric layer is very thin, the thermal budget for subsequent process is larger, and the film thickness will not reduce the space available for the device, but is thick enough to suppress the current leakage of the capacitor. Additionally, the sheet resistance of the HSG is decreased using a plasma doping process, so that the etching rate of the HSG layer is increased, and the HSG layer is easier to remove than the silicon substrate, enabling selective etching of the HSG layer without damaging the silicon substrate. By coupling the plasma doping process with the requisite tuned etching solution, the HSG layer is effectively removed. Finally, the present invention requires only one step of coating/recessing, eliminating additional etching stop layer.

Although the present invention has been particularly shown and described above with reference to the preferred embodiment, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A method of selectively etching a HSG layer, comprising the steps of:
   providing a semiconductor substrate having a trench therein;
   forming a buried oxide layer on the upper sidewall of the trench, wherein the buried oxide layer is adjacent to a top surface of the semiconductor substrate;
   conformally forming a HSG layer on the sidewall and bottom of the trench;
   conformally forming a doping dielectric layer on the HSG layer;
   filling a mask layer into the trench, and recessing the mask layer to a predetermined depth;
   removing the doping dielectric layer not covered by the mask layer to expose a portion of the HSG layer;
   ion doping the exposed HSG layer to form a plasma doping layer on the upper sidewall and top of the trench; and
   isotropically etching the plasma doping layer on the upper sidewall and top of the trench, with an etching selectivity higher than 1:20 for plasma doping layer to silicon substrate.

2. The method of claim 1, wherein the buried dielectric layer is an oxide layer.

3. The method of claim 2, wherein the buried dielectric layer is formed by oxygen ion implantation.

4. The method of claim 1, wherein the plasma doping layer is formed by boron ion implantation.

5. The method of claim 1, wherein the ion implantation condition of the plasma doping layer is 1E17~1E19 cm−3.

6. The method of claim 1, wherein the plasma doping layer is etched using a wet etching process.

7. The method of claim 6, wherein the wet etching process utilizing a solution with a mixture ratio of HF:HNO3:CH3COOH=1~1.5:3~3.3:8~8.2.

8. A method of selectively etching a HSG layer, comprising the steps of:
   providing a substrate having a trench therein;
   forming a buried oxide layer on the upper sidewall of the trench, wherein the buried oxide layer is adjacent to a top surface of the semiconductor substrate;
   forming a HSG layer on the sidewall and bottom of the trench;
   forming a doping dielectric layer on the HSG layer;
   filling a mask layer into the trench, and recessing the mask layer to a predetermined depth;
   removing the doping dielectric layer not covered by the mask layer to expose a portion of the HSG layer;
   ion doping the exposed HSG layer to form a plasma doping layer on the upper sidewall and top of the trench; and
   removing the plasma doping layer.

9. The method of claim 8, wherein the buried dielectric layer is an oxide layer.

10. The method of claim 9, wherein the buried dielectric layer is formed by oxygen ion implantation.

11. The method of claim 8, wherein the plasma doping layer is formed by boron ion implantation.

12. The method of claim 11, wherein the ion implantation condition of the plasma doping layer is 1E17~1E19 cm−3.

13. The method of claim 8, wherein the plasma doping layer is etched using a wet etching process.

14. The method of claim 13, wherein the wet etching process utilizes a solution with a mixture ratio of HF:HNO3:CH3COOH=1~1.5:3~3.3:8~8.2.

15. A method of trench capacitor fabrication, comprising the steps of:
   providing a substrate having a trench therein;
   forming a buried oxide layer on the upper sidewall of the trend, wherein the buried oxide layer is adjacent to a top surface of the semiconductor substrate;
   forming a HSG layer on the sidewall and bottom of the trench;
   forming a doping dielectric layer on the HSG layer;
   filling a mask layer into the trench, and recessing die mask layer to a predetermined depth;
   removing the doping dielectric layer not covered by the mask layer to expose a portion of the HSG layer;
   ion doping the exposed HSG layer to form a plasma doping layer on the upper sidewall and top of the trench;
   etching the plasma doping layer on the upper sidewall and top of the trench, and removing the remaining mask layer;
   forming a cap oxide layer on the bottom and sidewall of the trench; and
   performing a thermal process to form a buried plate of the capacitor.

16. The method of claim 15, wherein the buried dielectric layer is an oxide layer.

17. The method of claim 16, wherein the buried dielectric layer is formed by oxygen ion implantation.

18. The method of claim 15, wherein the plasma doping layer is formed by boron ion implantation.

19. The method of claim 18, wherein the ion implantation condition of the plasma doping layer is 1E17~1E19 cm−3.

20. The method of claim 15, wherein the plasma doping layer is etched using a wet etching process.

21. The method of claim 20, wherein the wet etching process utilizes a solution with a mixture ratio of HF:HNO3:CH3COOH=1~1.5:3~3.3:8~8.2.

* * * * *